(12) United States Patent
Kim et al.

(10) Patent No.: US 11,145,250 B2
(45) Date of Patent: Oct. 12, 2021

(54) ORGANIC LIGHT EMITTING DISPLAY DEVICE RELIABLY COMPENSATING THRESHOLD VOLTAGE OF A DRIVING TRANSISTOR AND METHOD OF DRIVING THE SAME

(71) Applicant: Samsung Display Co., Ltd., Yongin-Si (KR)

(72) Inventors: Cheol Min Kim, Yongin-si (KR); Dong Won Lee, Yongin-si (KR); Jae Keun Lim, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/102,538

(22) Filed: Aug. 13, 2018

(65) Prior Publication Data

US 2019/0156741 A1    May 23, 2019

(30) Foreign Application Priority Data

Nov. 21, 2017  (KR) ......................... 10-2017-0155827

(51) Int. Cl.
  *G09G 3/3233*  (2016.01)
  *G02B 27/01*  (2006.01)
  *G09G 3/3258*  (2016.01)
  *H01L 27/32*  (2006.01)
  *G09G 3/3291*  (2016.01)
  *G09G 3/3266*  (2016.01)

(52) U.S. Cl.
  CPC ....... *G09G 3/3233* (2013.01); *G02B 27/0172* (2013.01); *G09G 3/3258* (2013.01); *H01L 27/3276* (2013.01); *G02B 2027/0178* (2013.01); *G09G 3/3266* (2013.01); *G09G 3/3291* (2013.01); *G09G 2300/043* (2013.01); *G09G 2300/0819* (2013.01); *G09G 2300/0866* (2013.01); *G09G 2310/08* (2013.01)

(58) Field of Classification Search
  CPC .......... G09G 3/30; G09G 3/32; G09G 3/3208; G09G 3/3216; G09G 3/3225; G09G 3/3233; G09G 3/3241; G09G 3/325; G09G 3/3258; G09G 3/3283; G09G 3/3291
  USPC ................................... 345/76–83; 315/169.3
  See application file for complete search history.

(56) References Cited

U.S. PATENT DOCUMENTS 7,768,485 B2    8/2010  Uchino et al.
9,099,041 B2    8/2015  Iida et al.
(Continued)

FOREIGN PATENT DOCUMENTS

JP       4240059 B2        3/2009
KR   10-2016-0148790 A    12/2016
KR   10-2019-0012303 A     2/2019

*Primary Examiner* — Alexander Eisen
*Assistant Examiner* — Nelson Lam
(74) *Attorney, Agent, or Firm* — Innovation Counsel LLP (57) ABSTRACT

Provided herein may be an organic light emitting display device including: pixels coupled both to power source lines and scan lines that are formed on respective horizontal lines, and to data lines formed on respective vertical lines; a scan driver configured to supply scan signals to the scan lines; a first power source driver configured to supply first power sources to the power source lines; and a data driver configured to supply data signals to the data lines. The first power source driver may control light emitting operations of the pixels by successively stopping the supply of the first power sources to the power source lines.

17 Claims, 5 Drawing Sheets

(56) References Cited

U.S. PATENT DOCUMENTS

| | | | |
|---|---|---|---|
| 2010/0156762 A1* | 6/2010 | Choi | G09G 3/3233 |
| | | | 345/76 |
| 2011/0018855 A1* | 1/2011 | Miyazawa | G09G 3/3291 |
| | | | 345/211 |
| 2014/0132583 A1* | 5/2014 | Kim | G09G 3/3233 |
| | | | 345/212 |
| 2014/0168179 A1* | 6/2014 | Chung | H05B 33/0896 |
| | | | 345/205 |
| 2014/0192037 A1* | 7/2014 | Chung | G09G 3/2022 |
| | | | 345/212 |
| 2015/0054720 A1* | 2/2015 | Takeda | G09G 3/3233 |
| | | | 345/76 |
| 2015/0170574 A1* | 6/2015 | Kim | G09G 3/3233 |
| | | | 345/76 |
| 2015/0294623 A1* | 10/2015 | Toyomura | G09G 3/3233 |
| | | | 345/212 |
| 2015/0332626 A1* | 11/2015 | Toyomura | G09G 3/3233 |
| | | | 345/80 |
| 2015/0332635 A1* | 11/2015 | Lau | H01L 33/24 |
| | | | 345/691 |
| 2016/0148567 A1* | 5/2016 | Tomida | G09G 3/3233 |
| | | | 345/213 |
| 2016/0372047 A1 | 12/2016 | Kim et al. | |
| 2019/0035336 A1 | 1/2019 | Park et al. | |
| 2019/0198597 A1* | 6/2019 | Kim, II | G09G 3/3225 |
| 2020/0135091 A1* | 4/2020 | Kim | G09G 3/3233 |

* cited by examiner

ORGANIC LIGHT EMITTING DISPLAY DEVICE RELIABLY COMPENSATING THRESHOLD VOLTAGE OF A DRIVING TRANSISTOR AND METHOD OF DRIVING THE SAME

CROSS-REFERENCE TO RELATED APPLICATION

The present application claims priority to Korean patent application number 10-2017-0155827 filed on Nov. 21, 2017, the entire disclosure of which is incorporated herein in its entirety by reference.

BACKGROUND

Field of Invention

Various embodiments of the present disclosure relate to an organic light emitting display device and a method of driving the organic light emitting display device.

Description of Related Art

With the development of information technology, display devices that allow users to access information has grown increasingly important. Owing to the importance of the display device, the use of various display devices, such as a liquid crystal display (LCD) device and an organic light emitting display device, has increased.

Among display devices, organic light emitting display device displays an image using an organic light emitting diode which emits light via re-coupling of electrons and holes. The organic light emitting display device has an advantage in that it has a high response speed and is operated with low power consumption.

The organic light emitting display device includes pixels which are coupled with data lines and scan lines. Each of the pixels generally includes an organic light emitting diode, and a driving transistor for controlling the amount of current flowing through the organic light emitting diode. Each pixel emits light having a predetermined luminance when current is supplied from the drive transistor to the organic light emitting diode in response to a data signal.

The pixel may include a plurality of transistors and a plurality of capacitors to compensate for a deviation in threshold voltage of the driving transistor. While the pixel is operated, an operation of compensating for the threshold voltage of the driving transistor is performed on a horizontal line basis. However, the higher the resolution of a panel, the shorter the horizontal period. Thus, it becomes difficult to sufficiently compensate for the threshold voltage of the driving transistor. Consequently, a pixel capable of reliably compensating for the threshold voltage of the driving transistor so that the pixel may be applied to a high-resolution panel is needed.

Recently, various electronic devices which may be directly worn on the human body are being developed. Such devices are generally called wearable devices.

Particularly, a head mounted display device (hereinafter, referred to as "HMD") which is an example of such wearable devices may display a realistic image, thus providing a high degree of immersion. Thus, the HMD may be used for a variety of purposes, e.g., watching movies.

SUMMARY

Various embodiments of the present disclosure are directed to an organic light emitting display device which may be applied to a high-resolution HMD, and a method of driving the organic light emitting display device.

An embodiment of the present disclosure may provide an organic light emitting display device including: pixels each coupled to respective one of power source lines and respective one of scan lines, each of the power source lines and scan lines formed on respective horizontal lines, the pixels each coupled to respective one of data lines formed on respective vertical lines; a scan driver configured to supply scan signals to the scan lines; a first power source driver configured to supply first power sources to the power source lines; and a data driver configured to supply data signals to the data lines. The first power source driver may be configured to control light emitting operations of the pixels by successively stopping the supply of the first power sources to the power source lines.

In an embodiment, among the pixels, a pixel coupled to an i-th scan line (i is a natural number), an i-th power source line, and a j-th data line (j is a natural number) may include: an organic light emitting diode; a first transistor coupled between the i-th power source line and a second node, and configured to control, in response to a voltage of a first node, current flowing from the i-th power source line to a second power source via the organic light emitting diode; a second transistor coupled between the j-th data line and the first node, and configured to be turned on when the corresponding scan signal is supplied to the i-th scan line; and a storage capacitor coupled between the first node and the second node. The second node may be electrically coupled to an anode electrode of the organic light emitting diode.

In an embodiment, a one-frame period during which the pixels are driven may include a first period, a second period, a third period, and a fourth period. The pixels may be simultaneously driven during the first period, the second period, and the third period, and successively driven during the fourth period.

In an embodiment, during the first period, the scan driver may simultaneously supply the scan signals to the scan lines, the data driver may supply the data signals having a first reference voltage to the data lines, and the first node and the second node may be initialized based on the first reference voltage.

In an embodiment, during the second period, the first power source driver may simultaneously supply the first power sources to the power source lines, and a threshold voltage of the first transistor may be compensated for.

In an embodiment, during the third period, the data driver may supply the data signals having a second reference voltage lower than the first reference voltage to the data lines, and a voltage stored to the storage capacitor may be fixed.

In an embodiment, during the fourth period, the scan driver may successively supply the scan signals to the scan lines, the first power source driver successively stops the supply of the first power sources to the power source lines, and the data driver may supply the data signals having a voltage corresponding to image data.

In an embodiment, during the fourth period, the pixels successively emit light and may store the voltage corresponding to the image data during respective emission widths, and the emission widths may be set to an identical value.

In an embodiment, each of the emission widths may be set to have a duration from a starting point in time at which a corresponding one of the scan signals is supplied, to an ending point in time at which the supply of a corresponding one of the first power sources is stopped.

In an embodiment, a proportion of the emission width to the one-frame period may be 20% or less.

In an embodiment, at least one of the first transistor and the second transistor may be formed of an N-type transistor.

In an embodiment, each of the first period and the second period may be set to 100 μs or less.

In an embodiment, the third period may be shorter than the first period or the second period.

In an embodiment, the one-frame period may be set to 8.3 ms or less.

In an embodiment, the organic light emitting display device wherein a pixel density of the organic light emitting display device is 1600 ppi (pixel per inch) or more.

An embodiment of the present disclosure may provide a method of driving an organic light emitting display device including pixels each of which includes an organic light emitting diode, a driving transistor, and a storage capacitor, wherein a one-frame period during which the pixels are driven is divided into a first period, a second period, a third period, and a fourth period, the method including: initializing the pixels during the first period; compensating for a threshold voltage of a driving transistor of each of the pixels during the second period; fixing, during the third period, a voltage stored to the storage capacitor; and during the fourth period, storing a voltage corresponding to image data to the pixels and successively emitting light from the pixels.

In an embodiment, during the fourth period, the pixels may store the voltage corresponding to the image data during respective emission widths, and successively emit light. The emission widths may be set to an identical value.

DETAILED DESCRIPTION

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Figure 1:
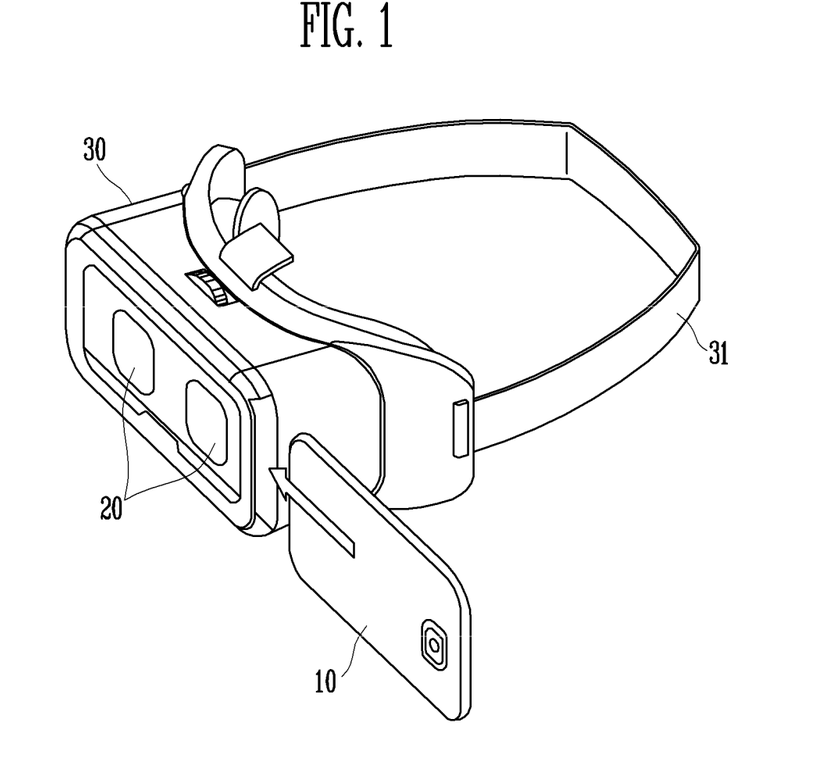
FIG. 1 is a diagram schematically illustrating a wearable apparatus in accordance with an embodiment of the present disclosure.
Figure 2:
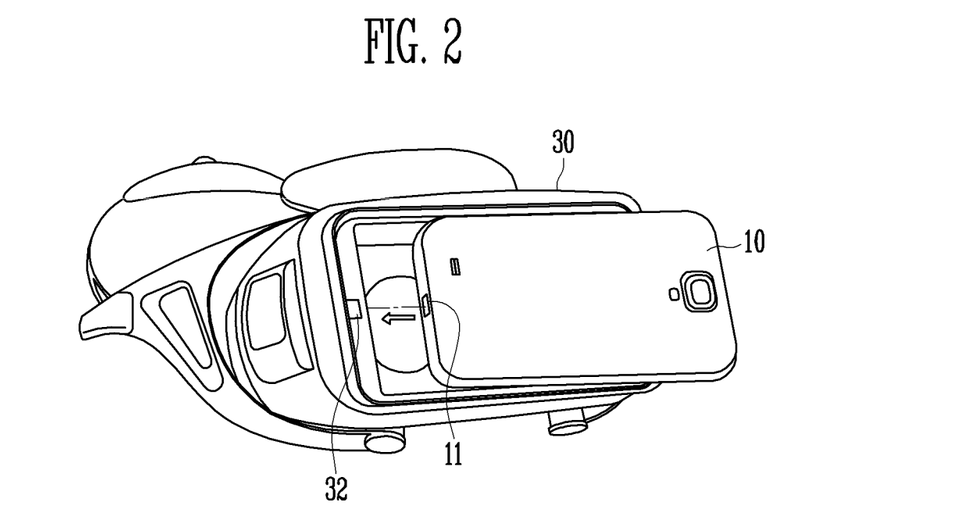
FIG. 2 is a diagram schematically illustrating a wearable apparatus in accordance with an embodiment of the present disclosure.

FIG. 1 is a diagram schematically illustrating a wearable apparatus in accordance with an embodiment of the present disclosure. FIG. 2 is a diagram schematically illustrating a wearable apparatus in accordance with an embodiment of the present disclosure.

FIGS. 1 and 2 each illustrates an HMD as an example of the wearable apparatus.

Referring to FIGS. 1 and 2, the HMD in accordance with an embodiment of the present disclosure includes a main body 30.

The main body 30 is provided with a band 31. A user may wear the main body 30 on his/her head using the band 31. The main body 30 has a structure capable of removably mounting a display device 10 thereto.

For example, the display device 10, which may be mounted to the HMD, may be a smartphone. Furthermore, in embodiments of the present disclosure, the display device 10 is not limited to a smartphone. For example, the display device 10 may be any one of electronic devices, such as a tablet PC, an electronic book reader, a personal digital assistant (PDA), a portable multimedia player (PMP), or a camera, provided with a display unit. Here, an organic light emitting display device may be used as the display unit.

When the display device 10 is mounted to the main body 30, a connector 11 of the display device 10 may be electrically coupled with a connector 32 of the main body 30 to make it possible to perform communication between the main body 30 and the display device 10.

Although not shown, the HMD may include at least one of a touch panel, a button, and a wheel key to control the display device 10.

When the display device 10 is mounted to the HMD, the display device 10 may be driven in a second mode. When the display device 10 is removed from the HMD, the display device 10 may be driven in a first mode. When the display device 10 is mounted to the HMD, the driving mode of the display device 10 may be automatically converted to the second mode. Alternatively, the driving mode of the display device 10 may be converted to the second mode by a setting operation of the user. For example, the display device 10 may be driven in the second mode at higher speed and higher resolution than in the first mode.

When the display device 10 is removed from the HMD, the driving mode of the display device 10 may be automatically converted to the first mode.

Alternatively, the driving mode of the display device 10 may be converted to the first mode by a setting operation of the user.

The HMD includes lenses 20 corresponding to the eyes of the user. Each lens 20 may be embodied by a fish-eye lens or a wide-angle lens so as to increase a field of view (FOV) of the user.

If the display device 10 is fastened to the main body 30, the user may see the display device 10 through the lenses 20. Hence, this may have the same effect as if the user watches a large screen spaced apart from him/her by a predetermined distance.

Because the user sees the display device 10 via the lenses 20, a valid display area may be divided into a high-visibility area and a low-visibility area. For example, an intermediate area based on both eyes of the user may have high visibility, and the other areas may have low visibility.

Figure 3:
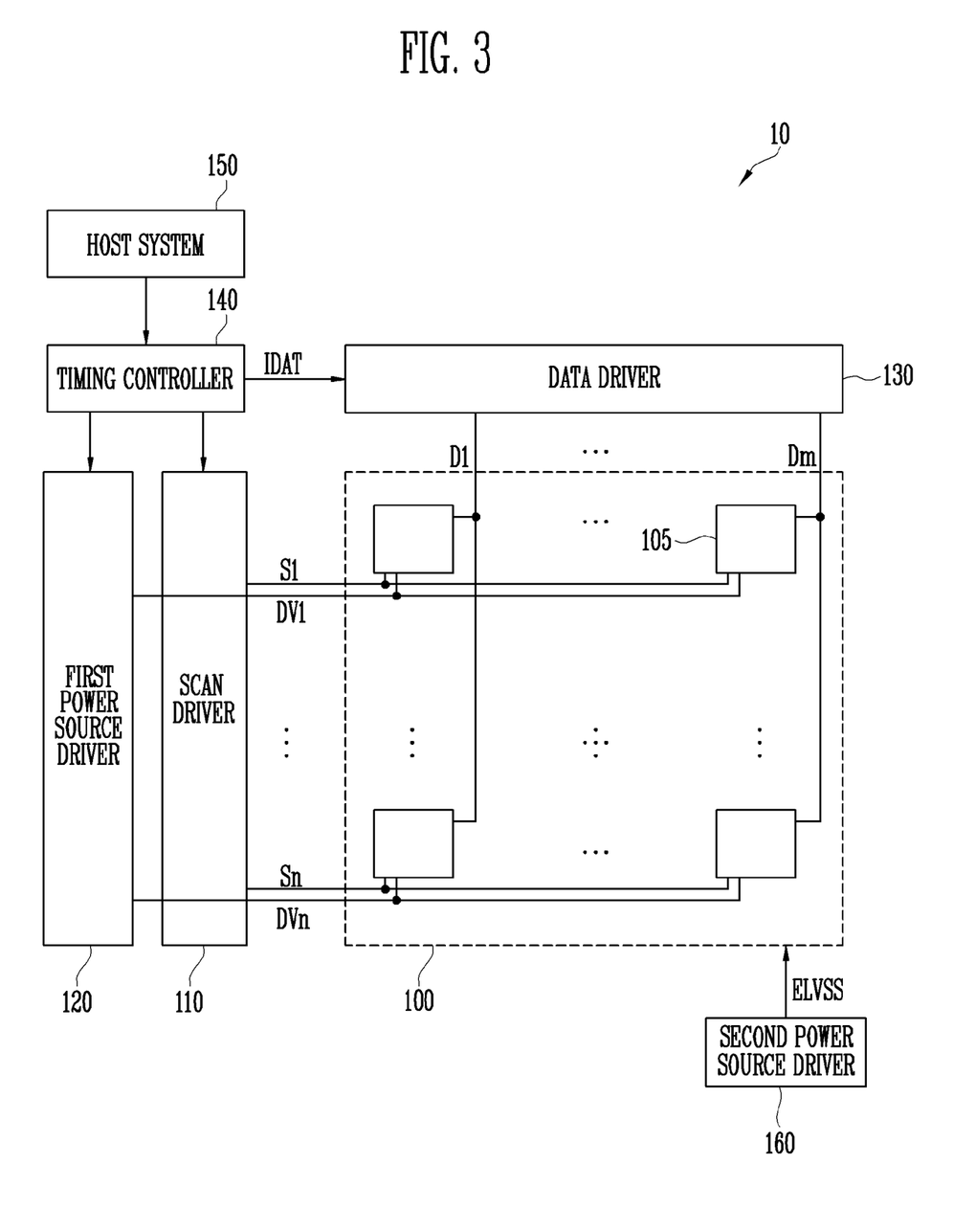
FIG. 3 is a block diagram illustrating an organic light emitting display device in accordance with an embodiment of the present disclosure.

FIG. 3 is a block diagram illustrating an organic light emitting display device in accordance with an embodiment of the present disclosure.

Referring to FIG. 3, the organic light emitting display device 10 in accordance with an embodiment of the present disclosure may include a pixel unit 100, a scan driver 110, a first power source driver 120, a data driver 130, a timing controller 140, a host system 150, and a second power source driver 160.

In an embodiment, the organic light emitting display device 10 may be embodied with a pixel density of 1600 ppi (pixel per inch) or more.

Furthermore, the organic light emitting display device 10 may be embodied with a resolution of 3840×3840 or more. The organic light emitting display device 10 may be driven at 120 Hz.

The pixel unit 100 may include pixels 105.

The pixels 105 may be coupled both to power source lines DV1 to DVn (n is a natural number) and scan lines S1 to Sn which are formed on respective horizontal lines, and to data lines D1 to Dm (m is a natural number) which are formed on respective vertical lines.

Each of the pixels 105 may emit light having a predetermined luminance in response to a data signal.

Figure 5:
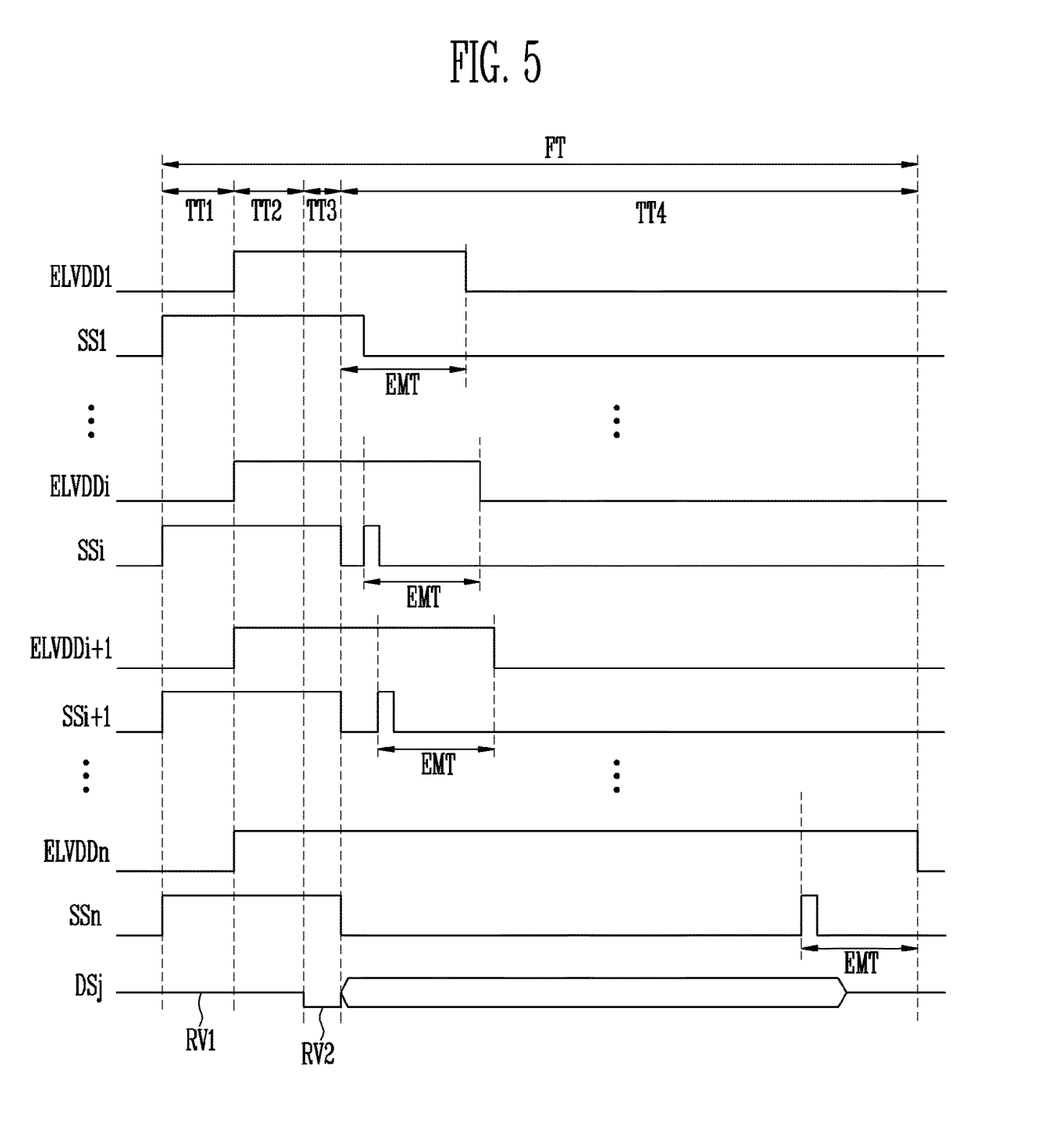
FIG. 5 is a timing diagram illustrating a method of driving a pixel in accordance with an embodiment of the present disclosure.

The pixels 105 may be driven on a one-frame period (FT) basis. Referring to FIG. 5, in an embodiment, the one-frame period FT may include a first period TT1, a second period TT2, a third period TT3, and a fourth period TT4.

The first period TT1 may be a period during which the pixels 105 are initialized. During the first period TT1, all of the pixels 105 may be simultaneously driven.

The second period TT2 may be a period during which the threshold voltages of the pixels 105 are compensated for. During the second period TT2, all of the pixels 105 may be simultaneously driven.

The third period TT3 may be a period during which voltages stored in storage capacitors of the pixels 105 are fixed. During the third period TT3, all of the pixels 105 may be simultaneously driven.

The fourth period TT4 may be a period during which the pixels 105 store voltages corresponding to image data IDAT and successively emit light. During the fourth period TT4, the pixels 105 may be successively driven on a horizontal line basis.

Details pertaining to this will be explained later herein with reference to FIGS. 4 and 5.

The scan driver 110 may provide scan signals to the scan lines S1 to Sn.

In an embodiment, the scan driver 110 may simultaneously supply scan signals to the scan lines S1 to Sn during the first period TT1, the second period TT2, and the third period TT3. The scan driver 110 may successively supply scan signals to the scan lines S1 to Sn during the fourth period TT4.

If scan signals are supplied to the scan lines S1 to Sn, transistors included in the respective pixels 105 may be turned on. To this end, the voltages of the scan signals may be set to a gate-on voltage (e.g., a high-level voltage) so that the transistors included in the respective pixels 105 can be turned on.

The first power source driver 120 may supply first power sources to the power source lines DV1 to DVn.

In an embodiment, the first power source driver 120 may supply the first power sources to the power source lines DV1 to DVn during the second period TT2 and the third period TT3. The first power source driver 120 may successively stop the supply of the first power sources to the power source lines DV1 to DVn during the fourth period TT4.

Here, when the first power source driver 120 successively stops the supply of the first power sources during the fourth period TT4, the light emitting operations of the pixels 105 may be successively stopped.

In other words, the first power source driver 120 may simultaneously start the supply of the first power sources to the power source lines DV1 to DVn during the second period TT2, and successively stop the supply of the first power sources to the power source lines DV1 to DVn during the fourth period TT4.

According to the above-mentioned operation, for example, referring to FIGS. 3 and 5, each of the first power sources (ELVDD1 to ELVDD) may have a constant supply width, and the supply widths of the first power sources (ELVDD1 to ELVDDn) may be set such that they are successively increased from the first power source line DV1 to the n-th power source line DVn.

The first power sources may be set to a first driving voltage so that current flows to the organic light emitting diodes included in the respective pixels 105.

That is, during the fourth period TT4, the light emitting operations of the pixels 105 may be controlled in such a way that the first power source driver 120 successively stops the supply of the first power sources, as described above.

The data driver 130 may generate data signals using image data IDAT input from the timing controller 140.

The data driver 130 may supply data signals to the data lines D1 to Dm.

In an embodiment, the data driver 130 may simultaneously supply data signals having a first reference voltage to the data lines D1 to Dm during the first period TT1 and the second period TT2. The data driver 130 may simultaneously supply data signals having a second reference voltage to the data lines D1 to Dm during the third period TT3. The second reference voltage may be lower than the first reference voltage.

The data driver 130 may supply data signals having voltages corresponding to image data IDAT data to the data lines D1 to Dm during the fourth period TT4.

Furthermore, the data driver 130 may supply data signals in synchronization with scan signals to be successively supplied to the scan lines S1 to Sn, during the fourth period TT4.

Therefore, here, the voltages corresponding to the image data IDAT may be stored to the pixels 105.

In addition, the data driver 130 may supply a constant voltage between the data signals. Here, the constant voltage may refer to a preset predetermined voltage and be used to initialize the data lines D1 to Dm.

Here, when the data driver 130 may simultaneously supply data signals having the second reference voltage to the data line D1 to Dm during the third period TT3, the compensation of the pixels 105 may be interrupted.

The timing controller 140 may control the drivers 110, 120, 130, and 160 based on image data IDAT, and timing signals such as a vertical synchronization signal, a horizontal synchronization signal, a data enable signal, and a clock signal which are output from the host system 150.

The host system 150 may supply the image data IDAT to the timing controller 140 through a predetermined interface. Furthermore, the host system 150 may supply the timing signals to the timing controller 140.

The second power source driver 160 may supply the second power source ELVSS to the pixels 105. The second power source ELVSS may be maintained at a constant voltage during a one-frame period.

The second power source ELVSS may be set to a second driving voltage lower than the first driving voltage so that current flows to the organic light emitting diodes included in the respective pixels 105.

In FIG. 3, there are illustrated n scan lines S0 to Sn, n power source lines DV1 to DVn, and m data lines D1 to Dm, but the present disclosure is not limited thereto. For instance, emission control lines, dummy scan lines, and dummy initialization lines may be additionally formed to secure the reliability of the operation.

Although, in FIG. 3, the scan driver 110, the first power source driver 120, the data driver 130, the timing controller 140, and the second power source driver 160 are illustrated as being provided separately from each other, at least some of the components may be integrated with each other, as needed.

The scan driver 110, the first power source driver 120, the data driver 130, the timing controller 140, and the second power source driver 160 may be installed using any one of various methods, such as chip on glass, chip on plastic, tape carrier package, and chip on film methods.

Figure 4:
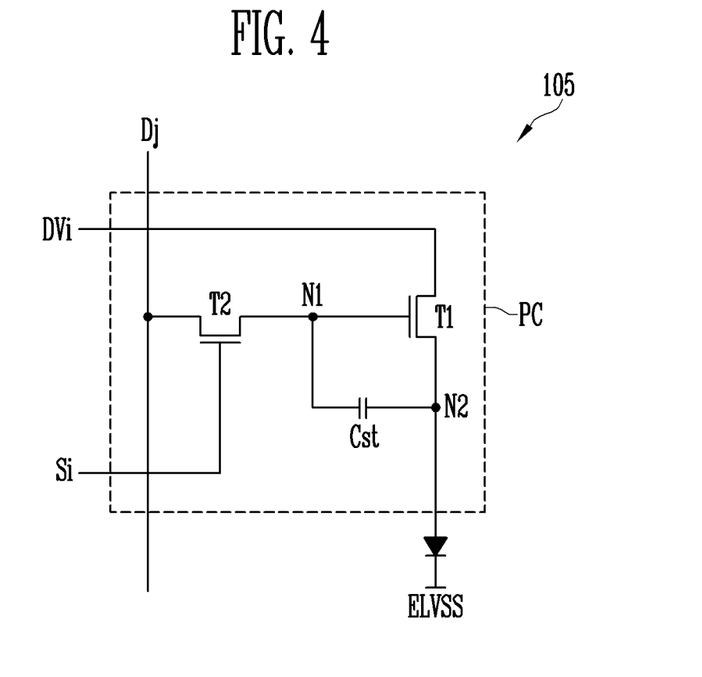
FIG. 4 is a circuit diagram illustrating a pixel in accordance with an embodiment of the present disclosure.

FIG. 4 is a circuit diagram illustrating a pixel 105 in accordance with an embodiment of the present disclosure.

In FIG. 4, for the sake of explanation, among the pixels 105, a pixel 105 coupled to an i-th scan line Si (i is a natural number), an i-th power source line DVi, and a j-th data line Dj (j is a natural number) is illustrated.

Referring to FIG. 4, the pixel 105 in accordance with an embodiment of the present disclosure may include an organic light emitting diode OLED, and a pixel circuit PC.

An anode electrode of the organic light emitting diode OLED may be coupled to the pixel circuit PC, and a cathode electrode thereof may be coupled to the second power source ELVSS. The organic light emitting diode OLED may emit light having a predetermined luminance corresponding to the amount of current supplied from the pixel circuit PC.

The pixel circuit PC may control the amount of current to be supplied to the organic light emitting diode OLED in response to a data signal.

The pixel circuit PC may include a first transistor T1, a second transistor T2, and a storage capacitor Cst.

The first transistor (or driving transistor) T1 may be coupled between the i-th power source line DVi and a second node N2. The second node N2 may refer to a node which is electrically coupled to the anode electrode of the organic light emitting diode OLED. A gate electrode of the first transistor T1 may be coupled to a first node N1.

The first transistor T1 may control, in response to the voltage of the first node N1, the amount of current to be supplied from the i-th power source line DVi to the second power source ELVSS via the organic light emitting diode OLED.

The second transistor T2 may be coupled between the j-th data line Dj and the first node N1. A gate electrode of the second transistor T2 may be coupled to the i-th scan line S1.

When a scan signal is supplied to the i-th scan line Si, the second transistor T2 is turned on so that the j-th data line Dj may be electrically coupled to the first node N1, and a data signal may be supplied from the j-th data line Dj to the storage capacitor Cst.

In an embodiment of the present disclosure, at least one of the first transistor T1 and the second transistor T2 may be formed of an N-type transistor (e.g., NMOS).

The storage capacitor Cst may be coupled between the first node N1 and the second node N2.

The storage capacitor Cst may be charged in response to a data signal from the j-th data line Dj.

FIG. 5 is a timing diagram illustrating a method of driving the pixel 105 in accordance with an embodiment of the present disclosure.

Referring to FIGS. 4 and 5, the one-frame period FT may include a first period TT1, a second period TT2, a third period TT3, and a fourth period TT4. In an embodiment, the one-frame period FT may be set to 8.3 ms or less.

Furthermore, scan signals SS1 to SSn may be respectively applied to the scan lines S1 to Sn (refer to FIG. 3). First power sources ELVDD1 to ELVDDn may be respectively applied to the power source lines DV1 to DVn (refer to FIG. 3). In detail, an i-th scan signal SSi may be applied to the i-th scan line Si, and an i-th first power source ELVDD1 may be applied to the i-th power source line DVi.

For the sake of explanation, the following description will be based on the pixel 105 shown in FIG. 4.

The first period TT1 may be a period during which the pixels 105 are initialized. During the first period TT1, all of the pixels 105 may be simultaneously driven.

During the first period TT1, scan signals SS1 to SSn may be simultaneously supplied, and a j-th data signal DSj having a first reference voltage RV1 may be supplied.

When the scan signals SS1 to SSn are supplied, the second transistor T2 of each of the pixels 105 may be turned on.

If the second transistor T2 is turned on, the j-th data line Dj and the first node N1 may be electrically coupled to each other.

Here, the first node N1 and the second node N2 may be initialized based on the first reference voltage RV1.

During the first period TT1, the pixels 105 may be initialized.

In an embodiment, the first period TT1 may be set to 100 μs or less.

The second period TT2 may be a period during which the threshold voltages of the pixels 105 are compensated for. During the second period TT2, all of the pixels 105 may be simultaneously driven.

During the second period TT2, in succession to the first period TT1, the scan signals SS1 to SSn may be simultaneously supplied, and the j-th data signal DSj having the first reference voltage RV1 may be supplied.

In addition, during the second period TT2, the first power sources ELVDD1 to ELVDDn may be simultaneously supplied.

If the first power sources ELVDD1 to ELVDDn are simultaneously supplied, the storage capacitor Cst of each of the pixels 105 may store a voltage corresponding to the threshold voltage of the first transistor T1.

In detail, as time passes, the voltage stored in the storage capacitor Cst may become close to the voltage corresponding to the threshold voltage of the first transistor T1.

In other words, during the second during TT2, the threshold voltage of the first transistor T1 of each of the pixels 105 may be compensated for.

In an embodiment, the second period TT2 may be set to 100 μs or less.

The third period TT3 may be a period during which the voltage stored in the storage capacitor Cst of each of the pixels 105 is fixed. During the third period TT3, all of the pixels 105 may be simultaneously driven.

During the third period TT3, in succession to the second period TT2, the scan signals SS1 to SSn may be simultaneously supplied, and the first power sources ELVDD1 to ELVDDn may be simultaneously supplied.

Furthermore, during the third period TT3, a j-th data signal DSj having a second reference voltage RV2 may be supplied. The second reference voltage RV2 may be set to a value lower than the first reference voltage RV1.

If the voltage of the j-th data signal DSj changes from the first reference voltage RV1 to the second reference voltage RV2, the voltage stored to the storage capacitor Cst at that time may be fixed.

In other words, during the third period TT3, the voltage stored in the storage capacitor Cst of each of the pixels 105 is fixed.

During the above-mentioned first to third periods TT1 to TT3, all of the pixels 105 may be simultaneously driven. Therefore, during the first to third periods TT1 to TT3, the voltage corresponding to the threshold voltage of the first transistor T1 may be stored in the storage capacitor Cst included in each of the pixels 105.

Furthermore, since the pixels 105 are simultaneously driven during the first to third periods TT1 to TT3, a sufficient amount of time for the pixels 105 to successively emit light may be secured. Hence, the threshold voltages of the pixels 105 may be reliably compensated for, whereby the organic light emitting display device may be applied to a high-resolution HMD.

In an embodiment, the third period TT3 may be set to a time shorter than the first period TT1 or the second period TT2.

The fourth period TT4 may be a period during which the pixels 105 store voltages corresponding to the image data IDAT and successively emit light. During the fourth period TT4, the pixels 105 may be successively driven on a horizontal line basis.

During the fourth period TT4, in succession to the third period TT3, the first power sources ELVDD1 to ELVDDn may be simultaneously supplied, and the operations of supplying the first power sources ELVDD1 to ELVDDn may be successively stopped.

Each of the first power sources ELVDD1 to ELVDDn may have a first driving voltage. Here, the first driving voltage may be set such that the pixels 105 can emit light in response to the data signal.

Furthermore, during the fourth period TT4, the scan signals SS1 to SSn may be successively supplied, and a j-th data signal DSj having a voltage corresponding to the image data IDAT (refer to FIG. 3) may be supplied. Here, the j-th data signal DSj may be synchronized with the scan signals SS1 to SSn that are successively supplied.

When the scan signals SS1 to SSn are successively supplied, the second transistor T2 of each of the pixels 105 may be turned on. If the second transistor T2 is turned on, the j-th data line Dj and the first node N1 may be electrically coupled to each other. In this case, a voltage obtained by compensating for a voltage corresponding to the threshold voltage of the first transistor T1 may be applied to the first node N1.

In an embodiment, the voltage corresponding to the threshold voltage of the first transistor T1 may be the sum of the voltage of the j-th data signal DSj and the voltage stored in the corresponding storage capacitor Cst.

Here, the first transistor T1 may control, in response to the voltage of the first node N1, the amount of current to be supplied from the i-th power source line DVi to the second power source ELVSS via the organic light emitting diode OLED.

Each of the pixels 105 may store a voltage corresponding to the image data IDAT (refer to FIG. 3) during a corresponding emission width EMT, and the pixels 105 may successively emit light. For example, the emission widths EMT of the pixels 105 may be set to an identical value.

Each emission width EMT may be set to a duration from a starting point in time at which a corresponding one of the scan signals SS1 to SSn that are successively supplied begins to be supplied, to an ending point in time at which the supply of a corresponding one of the first power sources ELVDD1 to ELVDDn that are successively interrupted is stopped.

In an embodiment, the proportion of each emission width EMT to the one-frame period FT may be 20% or less.

Figure 6:
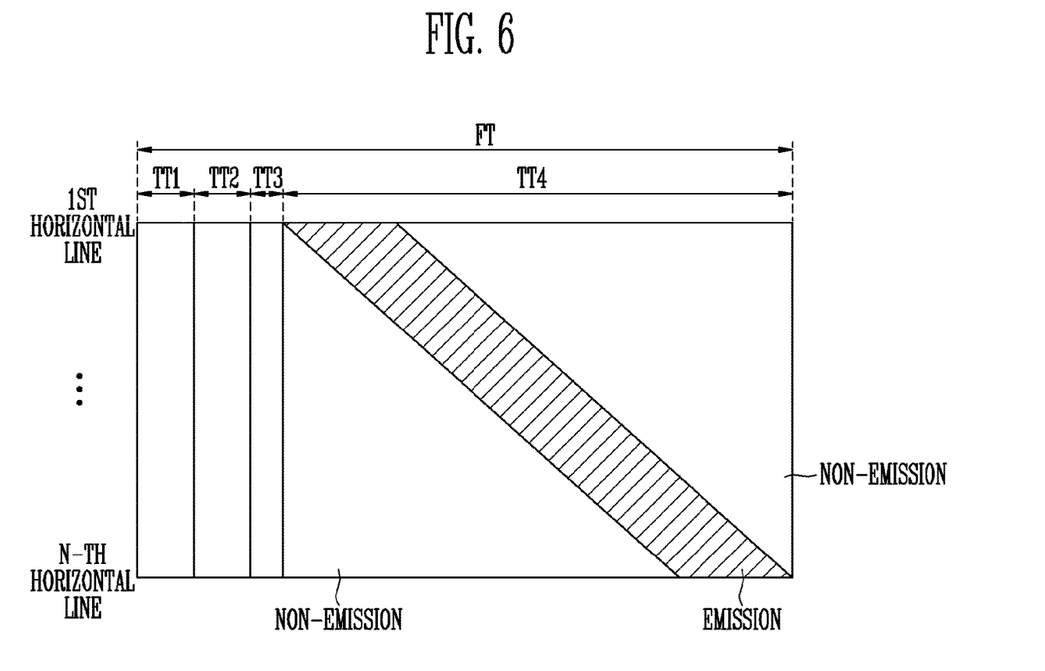
FIG. 6 is a diagram illustrating a one-frame period corresponding to the driving method of FIG. 5.

FIG. 6 is a diagram illustrating the one-frame period corresponding to the driving method of FIG. 5.

In FIG. 6, there is illustrated the case where all of the pixels 105 emit light in response to a data signal, and the horizontal axis denotes time, and the vertical axis denotes first to n-th horizontal lines.

Referring to FIG. 6, the pixels 105 may be simultaneously driven during the first to third periods TT1 to TT3. Here, during the first to third periods TT1 to TT3, a voltage corresponding to the threshold voltage of the first transistor T1 of each of the pixels 105 may be stored in the corresponding storage capacitor Cst.

During the fourth period TT4, the pixels 105 may be successively driven. Here, during the fourth period TT4, voltages corresponding to the data signal may be stored to the pixels 105 on a horizontal line basis. After the voltages corresponding to the data signal have been stored, the pixels 105 may successively emit light on a horizontal line basis. Here, respective emission periods of the pixels 105 may be set to an identical value regardless of the position of the horizontal line.

Figure 7:
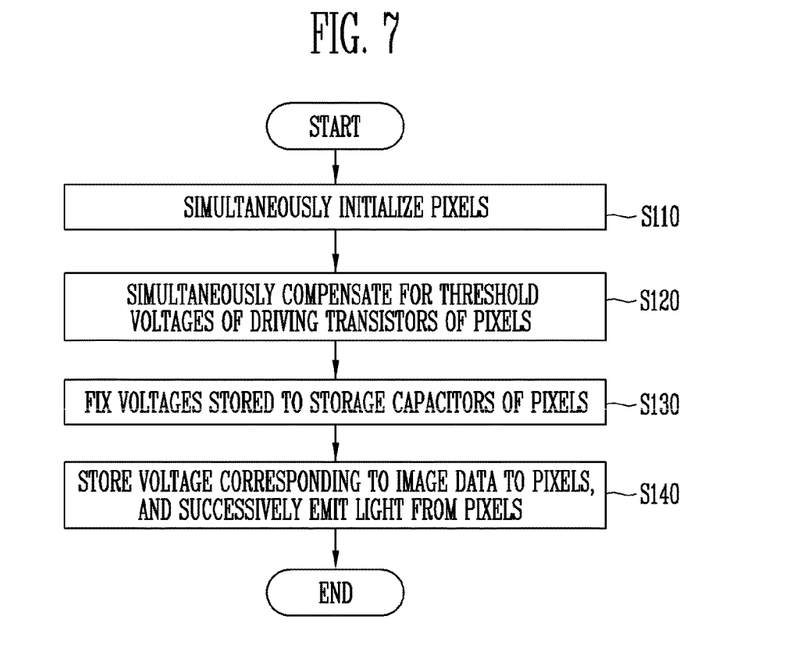
FIG. 7 is a flowchart illustrating a method of driving an organic light emitting display device in accordance with an embodiment of the present disclosure.

FIG. 7 is a flowchart illustrating a method of driving the organic light emitting display device 10 in accordance with an embodiment of the present disclosure.

Hereinafter, the method of driving the organic light emitting display device 10 will be described with reference to FIGS. 3 to 7.

At step S110, the pixels 105 may be simultaneously initialized.

At step S120, the threshold voltages of the first transistors T1 (driving transistors) of the pixels 105 may be simultaneously compensated for. In detail, the storage capacitor Cst of each of the pixels 105 may store a voltage corresponding to the threshold voltage of the first transistor T1.

Here, as time passes, the voltage stored in the storage capacitor Cst may become close to the voltage corresponding to the threshold voltage of the first transistor T1.

At step S130, the voltage stored in the storage capacitor Cst of each of the pixels 105 may be fixed.

At step S140, the voltages corresponding to the image data IDAT may be stored to the pixels 105, and the pixels 105 may successively emit light.

In various embodiments of an organic light emitting display device and a driving method thereof in accordance with the present disclosure, threshold voltages of respective driving transistors included in pixels may be simultaneously compensated for, whereby a sufficient amount of time may be allocated to a threshold voltage compensation period.

In other words, in various embodiments of the present disclosure, the threshold voltage of each driving transistor may be reliably compensated for, so that the organic light emitting display device may be applied to a high-resolution HMD.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light emitting display device comprising:
a plurality of pixels, the plurality of pixels in a plurality of pixel rows coupled to a plurality of power source lines and to a plurality of scan lines, and the plurality of pixels in a plurality of pixel columns coupled to a plurality of data lines;
a scan driver configured to supply scan signals to the scan lines;
a first power source driver configured to supply first power sources to the power source lines; and
a data driver configured to supply data signals to the data lines,
wherein a one-frame period includes a first period, a second period, a third period, and a fourth period,
wherein, in the first, second, and third periods, the scan driver is configured to simultaneously supply the plurality of pixels through the scan lines with the scan signals having a gate-on voltage to turn on a transistor, and, in the second period, the first power source driver is configured to simultaneously supply the first power sources to the plurality of pixels through the power source lines,
wherein, in the fourth period, the scan driver is configured to successively supply the scan lines with the scan signals having the gate-on voltage to turn on the transistor, and the first power source driver is configured to control light emitting operations of the plurality of pixels by successively stopping the supply of the first power sources to the plurality of pixels through the power source lines,
wherein, at a start point of the first period, the scan signals are simultaneously varied from a gate-off voltage to the gate-on voltage,
wherein, in the first, second, and third periods, each of the scan signals is turned on,
wherein, in the first period, the first power sources are not supplied to the power source lines,
wherein at a start point of the second period, voltage levels of power sources supplied to the plurality of pixels through the power lines simultaneously change from a first voltage level to a second voltage level, and
wherein, in the second and third periods, the first power sources supplied to the plurality of pixels through the power source lines are maintained to have the second voltage level.

2. The organic light emitting display device according to claim 1, wherein, among the pixels, a pixel coupled to an i-th scan line (i is a natural number), an i-th power source line, and a j-th data line (j is a natural number) comprises:
an organic light emitting diode;
a first transistor coupled between the i-th power source line and a second node, and configured to control, in response to a voltage of a first node, current flowing from the i-th power source line to a second power source via the organic light emitting diode;
a second transistor coupled between the j-th data line and the first node, and configured to be turned on when the corresponding scan signal is supplied to the i-th scan line; and
a storage capacitor coupled between the first node and the second node,
wherein the second node is electrically coupled to an anode electrode of the organic light emitting diode.

3. The organic light emitting display device according to claim 2,
wherein the pixels are simultaneously driven during the first period, and successively driven during the fourth period.

4. The organic light emitting display device according to claim 3, wherein the first period includes a first sub period, a second sub period, and a third sub period, and
wherein, during the first sub period, the scan driver simultaneously supplies the scan signals to the scan lines, the data driver supplies the data signals having a first reference voltage to the data lines, and the first node and the second node are initialized based on the first reference voltage.

5. The organic light emitting display device according to claim 4, wherein, during the second sub period, the first power source driver simultaneously supplies the first power sources to the power source lines, and a threshold voltage of the first transistor is compensated for.

6. The organic light emitting display device according to claim 5, wherein, during the third sub period, the data driver supplies the data signals having a second reference voltage lower than the first reference voltage to the data lines, and a voltage stored to the storage capacitor is fixed.

7. The organic light emitting display device according to claim 6, wherein, during the second period, the data driver supplies the data signals having a voltage corresponding to image data.

8. The organic light emitting display device according to claim 7, wherein, during the second period, the pixels successively emit light and store the voltage corresponding to the image data during respective emission widths, and the emission widths are set to an identical value.

9. The organic light emitting display device according to claim 8, wherein each of the emission widths is set to have a duration from a starting point in time at which a corresponding one of the scan signals is supplied to an ending point in time at which the supply of a corresponding one of the first power sources is stopped.

10. The organic light emitting display device according to claim 8, wherein a proportion of the emission width to the one-frame period is 20% or less.

11. The organic light emitting display device according to claim 2, wherein at least one of the first transistor and the second transistor is formed of an N-type transistor.

12. The organic light emitting display device according to claim 3, wherein the one-frame period is set to 8.3 ms or less.

13. The organic light emitting display device according to claim 3, wherein a pixel density of the organic light emitting display device is 1600 ppi (pixel per inch) or more.

14. The organic light emitting display device according to claim 4, wherein each of the first sub period and the second sub period is set to 100 μs or less.

15. The organic light emitting display device according to claim 4, wherein the third sub period is shorter than the first sub period or the second sub period.

16. A method of driving an organic light emitting display device comprising a plurality of pixels each of which includes an organic light emitting diode, a driving transistor, and a storage capacitor, wherein a one-frame period during which the plurality of pixels are driven is divided into a first period, a second period, a third period, and a fourth period, the method comprising:

simultaneously initializing the plurality of pixels by a scan driver simultaneously supplying scan signals to the pixels during the first, second, and third periods, each of the scan signals having a gate-on voltage to turn on a transistor;

simultaneously compensating for a threshold voltage of the driving transistor of each of the plurality of pixels by a first power source driver simultaneously supplying first power sources to the plurality of pixels through power source lines during the second period;

fixing, during the third period, a voltage stored to the storage capacitor; and during the fourth period, storing a voltage corresponding to image data to the plurality of pixels and successively emitting light from the plurality of pixels by the scan driver successively supplying the pixels with the scan signals each having the gate-on voltage to turn on the transistor and by the first power source driver successively stopping the supply of the first power sources to the plurality of pixels through the power source lines, wherein, at a start point of the first period, the scan signals are simultaneously varied from a gate-off voltage to the gate-on voltage, wherein, in the first, second, and third periods, each of the scan signals is turned on, wherein, in the first period, the first power sources are not supplied to the power source lines, wherein at a start point of the second period, voltage levels of power sources supplied to the plurality of pixels through the power lines simultaneously change from a first voltage level to a second voltage level, and wherein, in the second and third periods, the first power sources supplied to the plurality of pixels through the power source lines are maintained to have the second voltage level.

17. The method according to claim 16, wherein, during the fourth period, the pixels store the voltage corresponding to the image data during respective emission widths, and successively emit light, and wherein the emission widths are set to an identical value.

* * * * *